United States Patent
Kasuboski et al.

[11] Patent Number: 5,345,175
[45] Date of Patent: Sep. 6, 1994

[54] DIPOLAR WEIGHTED MR IMAGING IN-VIVO

[75] Inventors: Larry Kasuboski, Solon; Rao P. Gullapalli, Richmond Heights, both of Ohio

[73] Assignee: Picker International, Inc., Highland Hts., Ohio

[21] Appl. No.: 33,201

[22] Filed: Mar. 16, 1993

[51] Int. Cl.$^5$ .......................................... G01R 33/20
[52] U.S. Cl. ...................................................... 324/309
[58] Field of Search ............... 324/300, 307, 309, 310, 324/311, 312, 313, 314, 318, 322; 128/653.2, 653.5

[56] References Cited

U.S. PATENT DOCUMENTS

| | | | |
|---|---|---|---|
| 3,103,621 | 9/1963 | Fraser | 324/304 |
| 4,291,272 | 9/1981 | Hofer et al. | 324/313 |
| 4,403,190 | 9/1983 | Greenwood | 324/304 |
| 5,050,609 | 9/1991 | Balaban et al. | 128/653 |
| 5,159,270 | 10/1992 | Sepponen | 324/309 |
| 5,168,224 | 12/1992 | Maruizumi et al. | 324/300 |

OTHER PUBLICATIONS

"True 3-D Imaging of Limbs by NMR Zeugmatography with Off-Resonance Irradiation", Muller, et al., Europ. J. Radiol. 3 (1983), pp. 286–290 (no month).
"Magnetization Transfer Contrast (MTC) and Tissue Water Proton Relaxation *in Vivo*", Wolff, et al., Mag. Res. in Medicine 10, pp. 135–144 (1989) (no month).
"Lipid Bilayer and Water Proton Magnetization Transfer: Effect of Cholesterol", Fralix, et al., Mag. Res. in Medicine 18, pp. 214–223 (1991) (no month).
"Quantitative $^1$H Magnetization Transfer Imaging *in Vivo*", Eng, et al. Mag. Res. in Medicine, 17, pp. 304–314 (1991) (no month).
"Design and Implementation of Magnetization Transfer Pulse Sequences for Clinical Use", Hajnal, et al., Journal of Computer Assisted Tomography, Jan./Feb. 1992, pp. 7–18.
"Magnetization Transfer Contrast with Periodic Pulsed Saturation", Yeung, et al., Radiology 1992; 183:209–214 (no month).
"Pulsed Magnetization Transfer Contrast", Hu, et al., SMRM Book of Abstracts vol. 1, Aug. 1990, p. 352.
"Experimental Pulse NMR A Nuts and Bolts Approach", Fukushima, et al. Addison-Wesley Publishing Company, Inc., 1981, pp. 256–261 (no month).
"Principles of Magnetic Resonance", Slichter, Springer-Verlag; 1990, pp. 380–384 (no month).
"Measurement of Short Dipolar Relaxation Times by the Saturation Method", Emid, et al., Journal of Magnetic Resonance, 37, pp. 509–513 (no month).
"Off Resonance Field Pulsing for Contrast Manipulation in MRI: Application to Human Breast Tissues", Santyr, et al., SMRM Book of Abstracts, vol. 2., p. 1046, Aug. 1988.

*Primary Examiner*—Michael J. Tokar
*Attorney, Agent, or Firm*—Fay, Sharpe, Beall, Fagan, Minnich & McKee

[57] ABSTRACT

An RF pulse sequence (40, 42, 44) is applied to generate magnetic resonance in which a dipolar or bound spin system component of the magnetic resonance has a quadrature or 90° phase offset from a Zeeman or free spin system component of the magnetic resonance. The resultant resonance signal is encoded with magnetic field gradients (50, 52, 54) and sampled during a dipolar spin system resonance echo (46). The process is repeated altering the relative phase of the three RF pulses (40', 42', 44') and of a digital radio frequency receiver (28) such that the sampled dipolar and Zeeman spin system components are again in quadrature, but 90° offset in the opposite sense. The two resonance signals with their Zeeman components out of phase in the opposite sense are combined (64) such that the dipolar spin system components add and the Zeeman spin system components cancel. The combined or dipolar weighted resonance signals are collected in a data memory (66) with a plurality of different phase encodings and reconstructed (70) into an image representation (72) for selective display on a video monitor (76).

12 Claims, 2 Drawing Sheets

DIPOLAR WEIGHTED MR IMAGING IN-VIVO

BACKGROUND OF THE INVENTION

The present invention relates to the magnetic resonance arts. It finds particular application in conjunction with the selective magnetic resonance imaging of bound hydrogen atoms (dipolar) with the contribution of free hydrogen atoms (Zeeman) eliminated and will be described with particular reference thereto. It is to be appreciated, however, that the invention will also find application in conjunction with other magnetic resonance imaging and spectroscopy applications in which dipolar and Zeeman signals are selectively separated.

Heretofore, it was recognized that there are two pools of hydrogen atoms in human tissue. "Free" pool hydrogen atoms which have free mobility have $T_1 \approx T_2$. The free pool atoms are typified by the hydrogen dipoles in water. The "bound" pool hydrogen atoms which are tightly bound have $T_1 >> T_2$. The bound pool atoms are typified by the hydrogen dipoles in proteins, cell membranes, and other immobile hydrogen atoms. In magnetic resonance imaging and spectroscopy, the bound pool produces a low amplitude peak with a relatively wide frequency spectrum. The hydrogen dipoles of the free pool produce a peak which is many times higher and of a much narrower frequency spectrum. Typically, the magnetic resonance response from the bound pool is vastly overshadowed by the much larger response from the free pool. That is, the valuable diagnostic information to be found in proteins and other bound pool dipoles has been completely obscured by the much stronger response from the free pool hydrogen atoms in conventional magnetic resonance imaging techniques.

One technique for obtaining image information concerning the bound pool hydrogen dipoles is illustrated by Muller "True 3-D Imaging of Limbs By NMR Zeugmatography With Off-Resonance Irradiation", Europ. J. Radiol. Vol. 3, pp. 286–290 (1983). In this technique, resonance excitation RF pulses are applied with an "off-resonance" excitation pulse. That is, the pulse is of a different frequency than the relatively narrow high amplitude free proton pool, but within the resonant frequency range of the shorter, wider bound pool. The bound and free pools are in communication with each other such that some of the excitation energy is transferred from the bound pool to the free pool. This technique can be used, for example, to improve the contrast and emphasize muscle tissue, despite its high protein content. More specifically, the bound pool is excited and after a selected duration, an imaging sequence is conducted on the free pool. The magnetic coupling between the pools affects the contrast of the resultant image. By adjusting the duration between the excitation of the bound pool and the imaging sequence, the amount of magnetization transfer, hence, the changes in the contrast are adjustable. Images with different amounts of magnetization transfer may be compared or combined to distinguish various tissue abnormalities. See also U.S. Pat. No. 5,050,609 of Balaban.

In the nuclear magnetic resonance study of solids, Jeener and Broekaert "Nuclear Magnetic Resonance in Solids: Thermodynamic Effects of a Pair of RF Pulses", Phys. Rev. Vol. 157, No. 2, pp. 232–240 (1967) have developed a technique for identifying the contribution of two overlapping spin systems or pools. In particular, this technique is interested in separating the contribution of the small, wide magnetic resonance response of the dipolar energy or bound pool from the much larger, narrower response attributable to the Zeeman energies. In this technique, a 90° pulse excites resonance in both the dipolar and Zeeman spin systems. At a first selected duration after the 90° excitation, a 45° RF pulse is applied which selectively rotates the dipolar components along the equilibrium axis. The Zeeman components continue to dephase while the dipolar components aligned with the equilibrium axis remember the phase relationship which they had at the time of alignment. Some duration later, another 45° pulse is applied which rotates the dipolar components out of the equilibrium axis, reversing them such that they commence to rephase. A dipolar component echo is generated the first time duration after the second 45° pulse.

As illustrated in "Imaging of Polymer Materials", Blümich, Blümler, Günther, and Schauss, Advertising Material of Bruker (1970), the Jeener-Broekaert technique can be adapted to imaging polymeric solids. They describe an imaging technique without slice selection gradients and phase encoding in two dimensions. The described technique images an entire sample volume as a whole while preserving chemical shift information. The imaging times of the Jeener and Blümich techniques, although fine for inanimate solids, are too long for effective in-vivo imaging.

The present invention provides a new and improved imaging technique for imaging the bound or dipolar pool directly.

SUMMARY OF THE INVENTION

In accordance with the present invention, magnetic resonance is excited in both a dipolar or bound spin system and a Zeeman or free spin system and processed such that resultant Zeeman and dipolar resonance signal components are 90° out of phase in one direction of phase rotation. At least the dipolar component is then processed using a conventional magnetic resonance imaging sequence to produce a dipolar component echo during which a magnetic resonance signal is sampled. In a subsequent repetition, resonance is again excited in the dipolar and Zeeman spin systems such that the dipolar and Zeeman resonance signal components are 90° out of phase in an opposite direction of phase rotation. At least the dipolar component is then operated upon with the conventional magnetic resonance imaging sequence to produce another dipolar component echo during which the magnetic resonance signal is sampled. The first and second signals are combined such that the dipolar components add and the Zeeman components cancel.

In accordance with a more limited aspect of the present invention, a method of directly imaging dipoles of a dipolar or bound spin system is provided. A region of a subject which includes dipolar and Zeeman spin systems is positioned in an examination region. A first RF conditioning pulse sequence is performed which causes the excitation of resonance in the dipolar and Zeeman spin systems such that a first dipolar spin system resonance signal and a first Zeeman spin system resonance signal component are generated. The first dipolar and Zeeman spin system resonance signal components being substantially 90° out of phase in a first direction of phase rotation. A magnetic field gradient sequence is applied for phase and frequency encoding the first dipolar and Zeeman magnetic resonance signal components.

A second RF conditioning pulse sequence is applied to excite second dipolar and Zeeman spin system magnetic resonance components which are 90° out of phase in a second direction of phase rotation. The second direction being opposite to the first direction such that the second Zeeman spin system resonance signal component is substantially 180° out of phase with the first Zeeman spin system resonance signal component. The magnetic field gradient system is applied again for phase and frequency encoding the second dipolar and Zeeman spin system magnetic resonance signal components. The first and second dipolar and Zeeman spin system magnetic resonance signal components are combined such that the first and second dipolar spin system magnetic resonance signal components combine and the first and second Zeeman spin system magnetic resonance signal components tend to cancel. These steps are repeated for a plurality of different phase encodings to create a plurality of dipolar component weighted resonance signals. The dipolar component weighted resonance signals are reconstructed into an image representation.

In accordance with another aspect of the present invention, a method of magnetic resonance imaging is provided. A first RF pulse having a first phase is applied to excite resonance in dipolar and Zeeman spin systems. A second RF pulse having a second phase which is 90° rotated from the first phase is applied. A third RF pulse is applied which causes the resonance excited in the dipolar spin system to refocus into a dipolar magnetic resonance echo. The third RF pulse has a third phase which is substantially the same as the first phase. The resonance excited in the dipolar and Zeeman spin systems is phase encoded with a first phase encode gradient. A read gradient is applied during the dipolar magnetic resonance echo. During the read gradient, magnetic resonance signals are sampled with a digital receiver having a fourth phase. The fourth phase is 90° out of phase in the first angular direction from the third phase. The sampled magnetic resonance signals include dipolar and Zeeman spin system magnetic resonance signal components which are 90° out of phase in one phase rotation direction. These steps are repeated with the first phase rotated 180°, the second phase 90° out of phase relative to the rotated first phase in a second angular direction opposite to the first angular direction. The third phase is 180° out of phase with the rotated first phase. The receiver phase is 90° out of phase relative to the third phase in the second angular direction. In this manner, the second sampled magnetic resonance signals include dipolar and Zeeman spin system magnetic resonance signal components which are 90° out of phase in an opposite phase rotation direction to the first sampled magnetic resonance signals. The first and second sampled magnetic resonance signals are combined such that the first and second sampled dipolar spin system magnetic resonance signal components combine and the first and second sampled Zeeman spin system magnetic resonance signal components tend to cancel. These steps are repeated for a plurality of phase encodings. The combined magnetic resonance signals from the plurality of repetitions are reconstructed into an image representation.

The preceding techniques use a quadrature detection system. A single channel system can also be used with a receiver set to a proper phase such that only dipolar (and not Zeeman) components are sampled.

In accordance with another aspect of the present invention, a magnetic resonance imaging apparatus is provided. The apparatus includes a static magnetic field means for generating a static magnetic field through an examination region in which a portion of a subject that includes dipolar and Zeeman spin systems is positioned. A digital transmitter means generates radio frequency signals with a selectable phase offset. The digital receiver is connected with a resonator coil disposed adjacent the examination region. A digital radio frequency receiver which applies a selectable phase offset receives resonance radio frequency signals from the examination region. First and second buffer memories are connected with the digital receiver for receiving demodulated resonance signals therefrom. A gradient field means selectively causes magnetic field gradients across the examination region. The sequence control means controls the digital transmitter, the digital receiver, and the gradient magnetic field control means, including the relative phases of the transmitted radio frequency pulses and the phase of the receiver. In a first repetition, the sequence control means controls the relative phase of the digital transmitter and receiver such that dipolar and Zeeman spin system components of the resonance signal are 90° out of phase in a first phase direction. The magnetic resonance signal from the first phase being buffered in the first buffer means. In a second repetition, the sequence control means controls the relative phase of the digital transmitter and digital receiver such that the dipolar and Zeeman spin system components of the resultant magnetic resonance signal are substantially 90° out of phase in an opposite direction of phase rotation. The resonance signal from the second repetition is buffered in the second buffer means. A combining means combines the signals in the first and second buffer means such that the dipole spin system components combine and the Zeeman spin system components cancel to generate a dipole weighted data line which is stored in a data memory means. A reconstruction means reconstructs a plurality of data lines from the data memory means into an image representation.

One advantage of the present invention is that it images bound or dipolar spin systems directly.

Another advantage of the present invention resides in its short imaging times.

Another advantage of the present invention is that it is easily implemented on existing magnetic resonance imaging systems.

Still further advantages of the present invention will become apparent to those of ordinary skill in the art upon reading and understanding the following detailed description of the preferred embodiments.

BRIEF DESCRIPTION OF THE DRAWINGS

The invention may take form in various components and arrangements of components and in various steps and arrangements of steps. The drawings are only for purposes of illustrating the preferred embodiments and are not to be construed as limiting the invention.

DETAILED DESCRIPTION OF THE PREFERRED EMBODIMENTS

Figure 1:
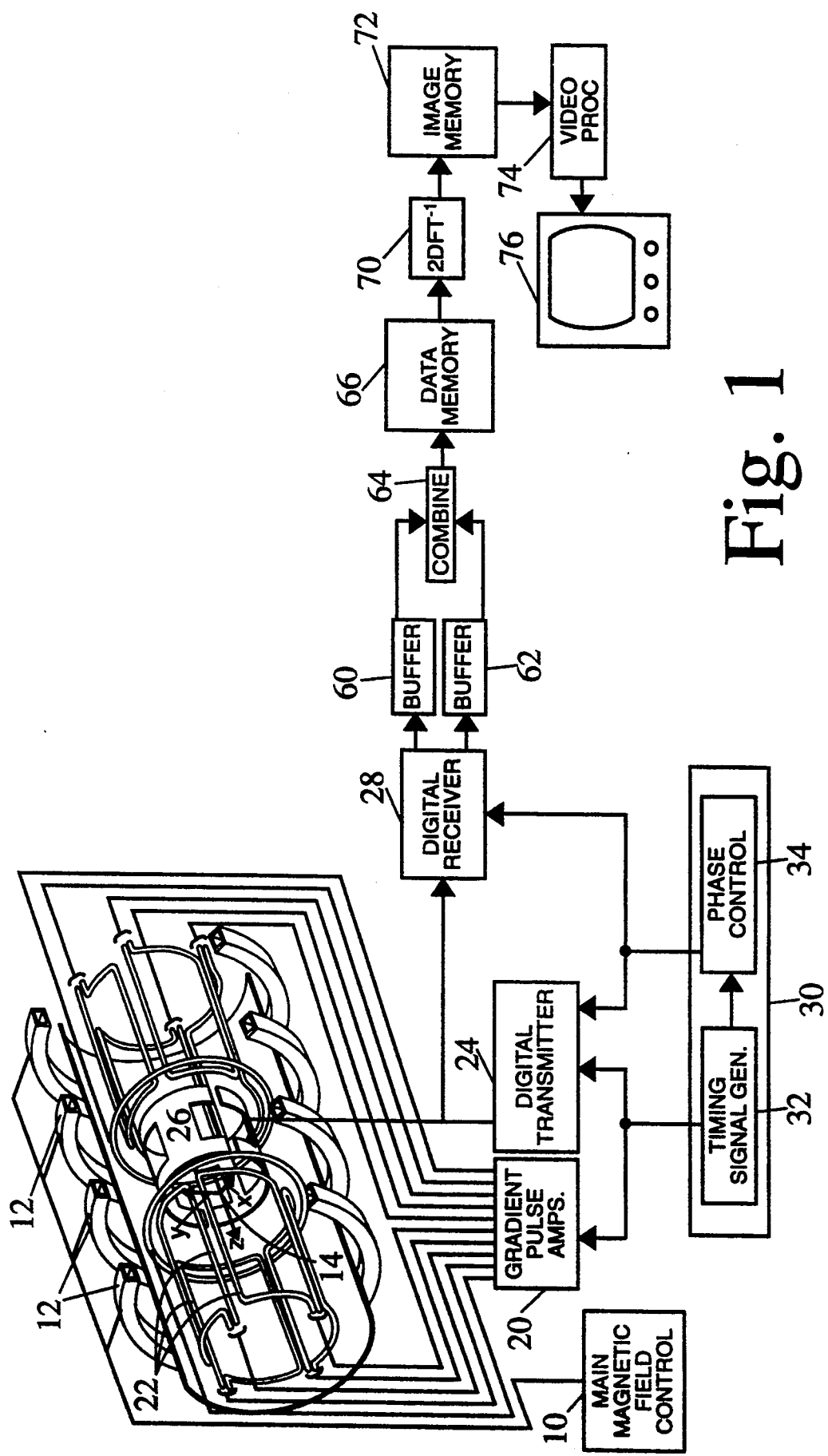
FIG. 1 is a diagrammatic illustration of a magnetic resonance system in accordance with the present invention; and, FIG. 2 illustrates a timing pattern for RF and magnetic field gradient pulses.

With reference to FIG. 1, a main magnetic field control means 10 controls superconducting or resistive magnets 12 such that a substantially uniform static magnetic field is created longitudinally along a z-axis through an examination region 14. A magnetic resonance echo generating means applies sequences of RF and magnetic field gradient pulses to cause magnetic resonance echoes, preferably field, echo-planar, or fast spin echoes, to be generated. More specifically, gradient pulse amplifiers 20 apply current pulses to gradient coils 22 to create magnetic fields along orthogonal x, y, and z-axes of the examination region 14. A digital radio frequency transmitter 24 transmits RF pulses to an RF coil 26 to transmit RF pulses into the examination region to excite magnetic resonance and to manipulate the excited resonance. A digital radio frequency receiver 28 receives radio frequency magnetic resonance signals emanating from the examination region. The resonance signals are picked up by the RF coil 26 or by surface coils (not shown). The digital receiver has a selectively adjustable phase offset.

A sequence and control means 30 controls the gradient pulse amplifiers 20, the digital transmitter 24, and the digital radio frequency receiver 28 to apply RF and gradient pulses in accordance with FIG. 2 and with relative phases as set forth in TABLE 1 below.

TABLE 1

| Repetition | 40 Pulse Phase | 42 Pulse Phase | 44 Pulse Phase | 28 Receiver Phase |
|---|---|---|---|---|
| 1a | 0° | 90° | 0° | 90° |
| 2a | 90° | 180° | 90° | 180° |
| 3a | 180° | 270° | 180° | 270° |
| 4a | 270° | 0° | 270° | 0° |
| 1b | 180° | 90° | 0° | 270° |
| 2b | 270° | 180° | 90° | 0° |
| 3b | 0° | 270° | 180° | 90° |
| 4b | 90° | 0° | 270° | 180° |

The sequence and control means 30 includes a timing signal generator 32 for initiating the generation of RF and gradient pulses at the time intervals described below in conjunction with FIG. 2. The sequence and control means 30 further includes a phase control means 34 for controlling the phase of the RF signals, the digital transmitter 24, and the digital receiver 28 in accordance with TABLE 1.

Figure 2:
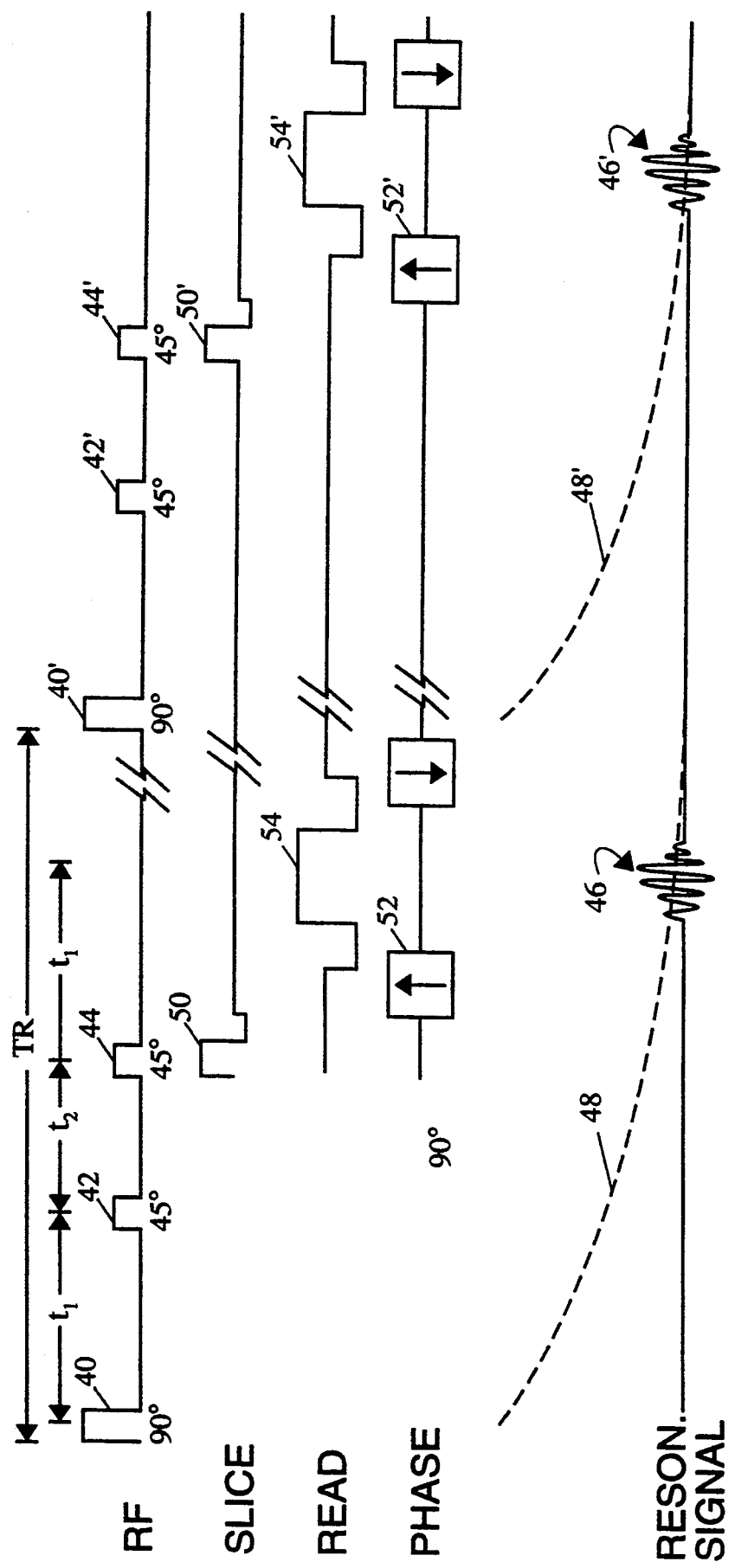

With reference to FIG. 2, the timing sequence control means 30 causes a preparation pulse sequence portion which includes a first excitation RF pulse 40. The first RF pulse 40, e.g. a 90° pulse, excites resonance in both the dipolar or bound spin system and the Zeeman or unbound spin system. The two spin systems dephase for a time $t_1$. At a time $t_1$ later, a second RF dipolar spin system manipulation pulse 42 is applied. The second RF pulse 42, e.g. a 45° pulse, converts Zeeman order which has evolved under the dipolar process to dipolar order. Although the dipolar or bound spin system vectors stop precessing and dephasing, they remember their relative phase as of the time of application of the second RF pulse 42. A time $t_2$ later, a third, dipolar spin system manipulation RF pulse 44 is applied to convert the stored dipolar order back to Zeeman order to allow for measurement, i.e. re-excite the bound spin system. The bound spin system rotates in an opposite direction commencing to rephase, such that at time $t_1$ later, a dipolar or bound spin system echo 46 is caused.

The third RF pulse 44 functions as the excitation pulse of an otherwise conventional magnetic resonance imaging sequence. Concurrent with the third RF pulse 44, a slice select gradient pulse S0 is applied. The slice select gradient 50 and the third RF pulse are tailored to limit the re-excitation of the dipolar or bound spin system to a selected plane or slice. Once the dipoles in the select plane or slice have been re-excited, a phase encode gradient 52 is applied to encode phase in the resultant resonance signal, particularly the bound spin system echo 46. A read gradient 54 is applied during the dipolar or bound spin system echo 46 to frequency encode the resonance signal. Of course, the detected resonance signal is the sum of the dipolar or bound echo and the residual Zeeman or unbound pools. The time intervals $t_1$ and $t_2$ are preferably iteratively adjusted to optimize the contrast and diagnostic value of the resultant images for the tissue type to be imaged.

After an appropriate delay during which phase, read, and slice unwind gradients may be applied to return the system to equilibrium more quickly, the timing sequence is repeated. That is, another preparation portion including a first RF pulse 40' and a second 45° pulse 42' are applied the duration $t_1$ apart. The duration $t_2$ later, the third RF pulse 44' is applied concurrently with the slice select gradient 50'. A phase encode gradient 52' and a read gradient 54' are applied to phase and frequency encode the resultant echo 46'.

In these two repetitions with the same slice, phase, and read encoding, the phase of the RF pulses and the digital receiver are altered such that the bound or dipolar signal component and the free or Zeeman signal component have opposite phase relationships in the otherwise identical two like sampling periods 46, 46'. With reference to TABLE 1, typical phases for the RF transmitter and receiver in the 1a repetition are a 0° phase shift in the first RF pulse 40 and the third RF pulse 44 and a 90° phase shift in the second RF pulse 42 and the digital receiver 28. In the repetition 1b with the same phase and frequency encoding, the first RF pulse 40' is 180° advanced in phase relative to the first sequence. The second RF pulse 42' now lags rather than leads the first RF pulse 40' by 90°. Although there is still a quadrature relationship, it is in the opposite sense. The third RF pulse 44' is 180° out of phase with the first RF pulse 40', i.e. 0°. The receiver phase is again 90° out of phase with the third RF pulse 44' but in the opposite sense, i.e. 270°. In this manner, the relative phase of the dipolar and Zeeman components is reversed relative to each other in the resultant signals 46, 46'.

With reference again to FIG. 1, the two phase reversed signals 46, 46' are temporarily stored in magnetic resonance signal buffers 60, 62. A signal combining means 64 combines the signals from buffer memories 60, 62 such that the dipolar or bound spin system components add and the Zeeman or free spin system components subtractively combine or cancel. The difference or bound spin system signal is loaded into a data memory 66 as the data line entry corresponding to the common phase encoding applied by phase encode gradients 52, 52' in repetitions 1a and 1b. This process is repeated with the phase encode gradients 52, 52' being stepped to generate each of the phase encode gradient steps for image reconstruction. The signals for the next phase encoding gradient step may be generated with digital RF transmitter and receiver phases as indicated in repetitions 2a and 2b of TABLE 1. The next phase encode step may be generated with the relative RF phases shown in repetitions 3a and 3b of TABLE 1. Similarly, a fourth phase encode gradient step may be phase encoded with signals as illustrated in repetitions 4a and 4b of TABLE 1. Alternately, rather than combining just two signals for each phase encode gradient step, more signals may be generated with each phase encoding. If more signals are to be averaged, all four repetitions illustrated in FIG. 1 can be used for each phase encoding step.

An image reconstruction means such as an inverse Fourier transform means 70 reconstructs the array of data in the data memory 66 into an electronic image representation which is stored in an image memory 72. A video processor 74 converts each image representation in the image memory 72 into appropriate video signals for display on a video monitor 76.

The invention has been described with reference to the preferred embodiment. Obviously, modifications and alterations will occur to others upon reading and understanding the preceding detailed description. It is intended that the invention be construed as including all such modifications and alterations insofar as they come within the scope of the appended claims or the equivalents thereof.

Having thus described the preferred embodiments, the invention is now claimed to be:

1. A method of directly imaging dipoles of a coupled dipolar and Zeeman spin system, the method comprising:
   (a) positioning a region of a subject which includes dipolar and Zeeman spin systems in an examination region;
   (b) performing a first RF conditioning pulse sequence which causes the excitation of resonance in the dipolar and Zeeman spin systems such that a first dipolar spin system resonance signal component and a first Zeeman spin system resonance signal component are generated which are substantially 90° out of phase in a first direction of phase rotation;
   (c) applying a magnetic field gradient sequence for phase and frequency encoding the first dipolar and Zeeman magnetic resonance signal components;
   (d) applying a second RF conditioning pulse sequence which excites second dipolar and Zeeman spin system magnetic resonance components which are 90° out of phase in a second direction of phase rotation, the second direction being opposite to the first direction such that the second Zeeman spin system resonance signal component is substantially 180° out of phase with the first Zeeman spin system resonance signal component;
   (e) applying the magnetic field gradient sequence for phase and frequency encoding the second dipolar and Zeeman spin system magnetic resonance signal components;
   (f) combining the first and second dipolar and Zeeman spin system magnetic resonance signal components such that the first and second dipolar spin system magnetic resonance signal components combine and the first and second Zeeman spin system magnetic resonance signal components tend to cancel;
   (g) repeating steps (a)–(f) with a plurality of different phase encodings to create a plurality of dipolar component weighted resonance signals;
   (h) reconstructing the dipolar component weighted resonance signals into an image representation.

2. The method as set forth in claim 1 wherein the first and second RF conditioning pulse sequences include:
   applying a first RF pulse to excite resonance in the dipolar and Zeeman spin systems;
   after a first duration, applying a second RF pulse which selectively aligns resonance vectors of the dipolar spin system with a relaxation axis;
   after a second duration, applying a third RF pulse which rotates the dipolar spin system resonance vectors out of alignment with the relaxation axis such that the dipolar spin system resonance vectors commence rephasing to form a dipolar spin system magnetic resonance echo the first time period after the third RF pulse, the first and second dipolar and Zeeman resonance signal components being sampled during the dipolar spin system magnetic resonance echo.

3. The method as set forth in claim 2 further including adjusting the first time period to optimize contrast in the image representation.

4. The method as set forth in claim 2 wherein the magnetic field gradient sequence includes:
   applying a slice select gradient during the third RF pulse;
   applying a read gradient during the dipole spin system magnetic resonance echo;
   applying a phase encode gradient between the slice select and read gradients.

5. The method as set forth in claim 2 wherein the magnetic resonance signals are received with a digital receiver, the digital receiver having an adjustable phase.

6. The method as set forth in claim 5 wherein
   in the first RF conditioning pulse sequence, the first and third RF pulses have the same phase, the second RF pulse is 90° out of phase with the first RF pulse in a first angular direction, and the digital receiver is 90° out of phase with the third RF pulse in the first angular direction; and
   in the second RF conditioning pulse sequence, the first RF pulse is 180° out of phase with the third RF pulse, the second RF pulse is 90° out of phase with the first RF pulse in a second angular direction and the radio frequency receiver is 90° out of phase with the third RF pulse in the second angular direction, the second angular direction being opposite to the first angular direction.

7. A method of magnetic resonance imaging comprising:
   (a) applying a first RF pulse having a first phase to excite resonance in dipolar and Zeeman spin systems;
   (b) applying a second RF pulse having a second phase, the second phase being 90° rotated in a first angular direction from the first phase;
   (c) applying a third RF pulse which causes the resonance excited in the dipolar spin system to refocus into a dipolar magnetic resonance echo, the third RF pulse having a third phase, the third phase being the same as the first phase;
   (d) phase encoding the resonance excited in the dipolar and Zeeman spin systems with a first phase encode gradient;
   (e) applying a read gradient during the dipolar magnetic resonance echo;

(f) during the read gradient, sampling magnetic resonance signals with a digital receiver having a fourth phase, the fourth phase being 90° in the first angular direction out of phase from the third phase, the first sampled magnetic resonance signals including dipolar and Zeeman spin system resonance signal components that are 90° out of phase in one phase rotation direction;

(g) repeating steps (a)-(f) with the first phase rotated 180°, the second phase 90° out of phase in a second angular direction relative to the rotated first phase, the second angular direction being opposite to the first angular direction, the third phase being 180° out of phase with the rotated first phase, and the receiver phase being 90° out of phase to the third phase in the second angular direction such that in the second sampled magnetic resonance signals include the dipolar and Zeeman spin system magnetic resonance signal components that are substantially 90° out of phase in an opposite phase rotation direction relative to the first sampled magnetic resonance signals;

(h) combining the first and second sampled magnetic resonance signals such that the first and second sampled dipolar spin system magnetic resonance signal components combine and the first and second sampled Zeeman spin system magnetic resonance signal components tend to cancel;

(i) repeating steps (a)-(h) for a plurality of phase encodings;

(j) reconstructing the combined magnetic resonance signals into an image representation.

8. The method as set forth in claim 7 further including converting the image representation into a human-readable display.

9. The method as set forth in claim 7 further including applying a slice select gradient concurrently with the third RF pulse.

10. A magnetic resonance method comprising:
exciting resonance in both a dipolar spin system and a Zeeman spin system;
receiving and converting the magnetic resonance into an electrical resonance signal which includes dipolar and Zeeman spin system resonance components that are substantially 90° out of phase in one direction of phase rotation;
re-exciting magnetic resonance in the dipolar and Zeeman spin systems and converting the resultant resonance into a second electrical magnetic resonance signal which includes dipolar and Zeeman spin system resonance components which are substantially 90° out of phase in an opposite direction of phase rotation;
combining the first and second electrical resonance signals such that the dipolar components additively combine and the Zeeman spin system resonance components subtractively combine.

11. A magnetic resonance imaging apparatus comprising:
a means for generating a static magnetic field through an examination region in which a portion of a subject having dipolar and Zeeman spin systems is disposed;
a digital transmitter means for generating radio frequency signals for transmission into the examination region with a selectable phase;
a digital receiver means for receiving and demodulating resonance signals received from the examination region with a selectable phase offset to generate an electrical magnetic resonance signal;
a first buffer means and a second buffer means connected with the digital receiver means for receiving electrical resonance signals therefrom;
a gradient magnetic field means for selectively generating magnetic field gradients across the examination region;
a sequence control means (1) for controlling timing and phase of the digital transmitter means and the digital receiver means and for controlling timing of the gradient magnetic field means such that in a first repetition, magnetic resonance is excited in both the dipolar and Zeeman spin systems to produce a first magnetic resonance signal which has dipolar and Zeeman spin system components which are 90° out of phase in a first direction of phase rotation, the first magnetic resonance signal being buffered in the first buffering means, and (2) for controlling the timing and phase of the digital transmitter and receiver and the timing of the gradient magnetic field means in a second repetition such that magnetic resonance is excited in the dipolar and Zeeman spin systems to produce a second magnetic resonance signal which has dipolar and Zeeman spin system resonance components which are 90° out of phase in a second direction of phase rotation, the second direction of phase rotation being opposite to the first direction of phase rotation, the second magnetic resonance signal being buffered in the second buffering means;
a combining means for combining the first and second magnetic resonance signals from the first and second buffer means such that the dipolar spin system resonance components combine and the Zeeman spin system resonance components cancel to produce a dipolar spin system weighted resonance signal;
an image reconstruction means for reconstructing a plurality of the dipolar spin system weighted magnetic resonance signals into an electronic image representation;
an image memory means for storing the electronic image representation.

12. The apparatus as set forth in claim 11 further including a display means for converting the electronic image representation into a human-readable display.

* * * * *